US012527067B2

(12) United States Patent
Sekiya

(10) Patent No.: US 12,527,067 B2
(45) Date of Patent: Jan. 13, 2026

(54) WAFER PROCESSING METHOD AND DEVICE CHIP MANUFACTURING METHOD

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 380 days.

(21) Appl. No.: 18/469,697

(22) Filed: Sep. 19, 2023

(65) Prior Publication Data

US 2024/0105513 A1 Mar. 28, 2024

(30) Foreign Application Priority Data

Sep. 27, 2022 (JP) ................................. 2022-153264

(51) Int. Cl.
 *H10D 84/03* (2025.01)
 *B23K 26/53* (2014.01)
 *H01L 21/304* (2006.01)
 *B23K 101/40* (2006.01)

(52) U.S. Cl.
 CPC ........... *H10D 84/035* (2025.01); *B23K 26/53* (2015.10); *H01L 21/304* (2013.01); *H10D 84/038* (2025.01); *B23K 2101/40* (2018.08)

(58) Field of Classification Search
 None
 See application file for complete search history.

(56) References Cited

FOREIGN PATENT DOCUMENTS

JP 2017028072 A 2/2017

*Primary Examiner* — Anthony Ho
(74) *Attorney, Agent, or Firm* — Greer Burns & Crain Ltd.

(57) ABSTRACT

A wafer processing method for processing a wafer having a plurality of devices formed on a first surface thereof includes positioning a first focal point of a first laser beam at a first height and emitting the first laser beam onto the wafer from a side on which a second surface lies, thereby forming a protective layer, positioning a second focal point of a second laser beam at a second height being more distant from the first surface than the first height and emitting the second laser beam onto the wafer from the side on which the second surface lies, thereby forming a separation start position made up of a modified layer and a crack, and applying an external force to the wafer to divide the wafer at the separation start position and separating a piece including the second surface from the wafer.

5 Claims, 10 Drawing Sheets

WAFER PROCESSING METHOD AND DEVICE CHIP MANUFACTURING METHOD

BACKGROUND OF THE INVENTION

Field of the Invention

The present invention relates to a method for processing a wafer having a first surface and a second surface opposite to the first surface and having a plurality of devices formed on the first surface, and to a device chip manufacturing method for forming individual device chips by dividing the processed wafer.

Description of the Related Art

Chips of semiconductor devices are generally manufactured using a disk-shaped wafer made of a semiconductor material, such as silicon (Si) or silicon carbide (SiC). Individual device chips can be obtained when a plurality of devices are arranged on a first surface of the wafer, the wafer is ground from a second surface thereof and is thereby thinned, and the wafer is divided into pieces each having one of the devices. The device chips obtained are installed on various types of electronic devices, such as mobile phones and personal computers, and are used therein.

However, there have been problems in that, in a case where a material that has a high Mohs hardness, such as silicon carbide, is ground, in particular, the amount of wear of grindstones, which are tools used for grinding, is large, and much time is required for the processing. Thus, a method has been developed in which a separation start position (i.e., a peeling layer) made up of a modified layer and a crack is formed at a certain height within the wafer so as to extend throughout the wafer, and an external force is applied to the wafer to separate the wafer into two pieces at the separation start position, resulting in thinning of the wafer (see Japanese Patent Laid-open No. 2017-28072).

SUMMARY OF THE INVENTION

The formation of the separation start position is accomplished by causing a laser beam to be emitted onto the wafer from the side on which the second surface lies, while a focal point of the laser beam is caused to move throughout a region where the separation start position is planned to be formed. However, this method has a problem in that components of the laser beam which make no contribution to the formation of the separation start position travel further within the wafer to reach the first surface and may cause damage to the devices arranged on the first surface. This leads to a need to limit the power of the laser beam, or a need to form the separation start position at a height at a considerable distance from the first surface, which results in a failure to efficiently form the separation start position.

Accordingly, the present invention has been conceived to provide a wafer processing method that enables efficient thinning of a wafer having devices arranged on a first surface thereof, and a device chip manufacturing method that enables efficient manufacture of device chips through division of the wafer.

In accordance with an aspect of the present invention, there is provided a wafer processing method for processing a wafer having a first surface and a second surface opposite to the first surface and having a plurality of devices formed on the first surface, the wafer processing method including a protective layer forming step of positioning a first focal point of a first laser beam having a wavelength capable of penetrating the wafer at a first height within the wafer and emitting the first laser beam onto the wafer from a side on which the second surface lies while moving the first focal point and the wafer relative to each other along the first surface, thereby forming a protective layer at the first height in the wafer, a separation start position forming step of, after the protective layer forming step, positioning a second focal point of a second laser beam having a wavelength capable of penetrating the wafer at a second height within the wafer, the second height being more distant from the first surface than the first height, and emitting the second laser beam onto the wafer from the side on which the second surface lies while moving the second focal point and the wafer relative to each other along the first surface, thereby forming a modified layer at the second height in the wafer and forming a crack extending from the modified layer, to form a separation start position made up of the modified layer and the crack, and a separation step of, after the separation start position forming step, applying an external force to the wafer to divide the wafer at the separation start position and separating a piece including the second surface from the wafer, thereby eliminating the second surface from the wafer.

Preferably, the first laser beam in the protective layer forming step has a smaller impact on the devices than an impact to be made by the second laser beam on the devices if the second laser beam reaches the first surface without passing through the protective layer.

Preferably, the wafer processing method further includes a grinding step of, after performing the separation step, grinding a rear surface of the wafer exposed on a side opposite to the first surface, thereby removing the protective layer and flattening the rear surface.

In accordance with another aspect of the present invention, there is provided a device chip manufacturing method for manufacturing device chips by dividing a wafer having a first surface and a second surface opposite to the first surface and having a plurality of devices formed on the first surface, the device chip manufacturing method including a protective layer forming step of positioning a first focal point of a first laser beam having a wavelength capable of penetrating the wafer at a first height within the wafer and emitting the first laser beam onto the wafer from a side on which the second surface lies while moving the first focal point and the wafer relative to each other along the first surface, thereby forming a protective layer at the first height in the wafer, a separation start position forming step of, after the protective layer forming step, positioning a second focal point of a second laser beam having a wavelength capable of penetrating the wafer at a second height within the wafer, the second height being more distant from the first surface than the first height, and emitting the second laser beam onto the wafer from the side on which the second surface lies while moving the second focal point and the wafer relative to each other along the first surface, thereby forming a modified layer at the second height in the wafer and forming a crack extending from the modified layer, to form a separation start position made up of the modified layer and the crack, a separation step of, after the separation start position forming step, applying an external force to the wafer to divide the wafer at the separation start position and separating a piece including the second surface from the wafer, thereby eliminating the second surface from the wafer, a grinding step of, after the separation step, grinding a rear surface of the wafer exposed on a side opposite to the first surface, thereby removing the protective layer and flattening the rear surface, and a division step of dividing the wafer into pieces each having one of the devices, thereby manufacturing a plurality of device chips each provided with one of the devices.

Preferably, the first laser beam in the protective layer forming step has a smaller impact on the devices than an impact to be made by the second laser beam on the devices if the second laser beam reaches the first surface without passing through the protective layer.

In the wafer processing method and the device chip manufacturing method according to aspects of the present invention, first, the first focal point of the first laser beam is positioned at the first height, and the protective layer is formed through the first laser beam. Thereafter, the second focal point of the second laser beam is positioned at the second height, which is more distant from the first surface than the first height, and the second laser beam is emitted to the second focal point. As a result, the separation start position is formed in the wafer.

In this case, when the second laser beam is emitted onto the wafer, components of the second laser beam which pass through the second focal point and travel toward the first surface of the wafer reach the protective layer before reaching the first surface. Then, the second laser beam reaches the first surface in a state of being reduced in intensity due to reflection, absorption, diffusion, etc. of the second laser beam by the protective layer. It is also possible that the second laser beam does not reach the first surface. Thus, the formation of the protective layer reduces the likelihood that the devices will be damaged when the second laser beam is emitted onto the wafer.

In a case where the protective layer is formed in the wafer, it is possible to cause the second laser beam to be focused at a height closer to the first surface than that in the related art, and the separation start position can thus be formed at a height closer to the first surface. In this case, the amount of material to be cut off from the wafer when the wafer is ground and thereby thinned after the separation step can be reduced, leading to a reduction in the amount of wear of grindstones and an extended life of the grindstones.

In addition, in this case, the piece separated from the wafer can be increased in thickness. This separated piece having an increased thickness can be used as a new wafer for manufacturing device chips. Even when a device wafer is produced from this new wafer, a thick separated piece can be left. That is, it is made possible to manufacture a greater number of device chips with a reduced loss of the material.

Accordingly, in accordance with aspects of the present invention, there are provided a wafer processing method that enables efficient thinning of a wafer having devices arranged on a first surface thereof, and a device chip manufacturing method that enables efficient manufacture of device chips through division of the wafer.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
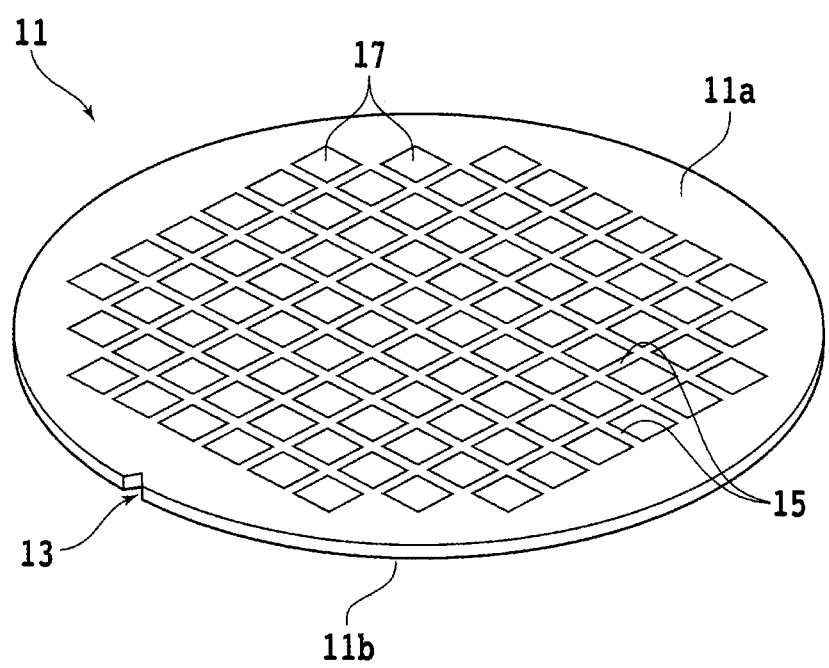
FIG. 1 is a perspective view that schematically illustrates a wafer.

An embodiment of the present invention will be described below with reference to the accompanying drawings. FIG. 1 is a perspective view that schematically illustrates a wafer 11 to be processed by a wafer processing method and a device chip manufacturing method according to the present embodiment. Schematic sectional views of the wafer 11 are presented in FIG. 4 and so on. The wafer 11 is made of a semiconductor material, such as silicon (Si) or silicon carbide (SiC). Note, however, that the material of the wafer 11 is not limited to the above examples. The wafer 11 is disk-shaped, and has a first surface (i.e., a front surface) 11a and a second surface (i.e., a rear surface) 11b, each of which is substantially circular. The second surface 11b lies on the side of the wafer 11 opposite to the first surface 11a in the thickness direction of the wafer 11. The wafer 11 has a diameter of, for example, approximately 300 mm (12 inches), and has a thickness of, for example, approximately 500 μm measured from the first surface 11a to the second surface 11b. Note, however, that the diameter and thickness of the wafer 11 are not limited to the above examples.

A notch 13 that indicates the crystal orientation of the wafer 11 is defined in an outer circumferential portion of the wafer 11. The notch 13 indicates a specific crystal orientation included in the wafer 11. As illustrated in FIG. 1, a plurality of planned dividing lines (streets) 15 are set in a grid pattern on the first surface 11a. Devices 17, such as integrated circuits (ICs), are formed in respective regions defined by the plurality of planned dividing lines 15. As described below, device chips each provided with one of the devices 17 can be manufactured by thinning the wafer 11 and dividing the wafer 11 along the planned dividing lines 15.

Figure 2:
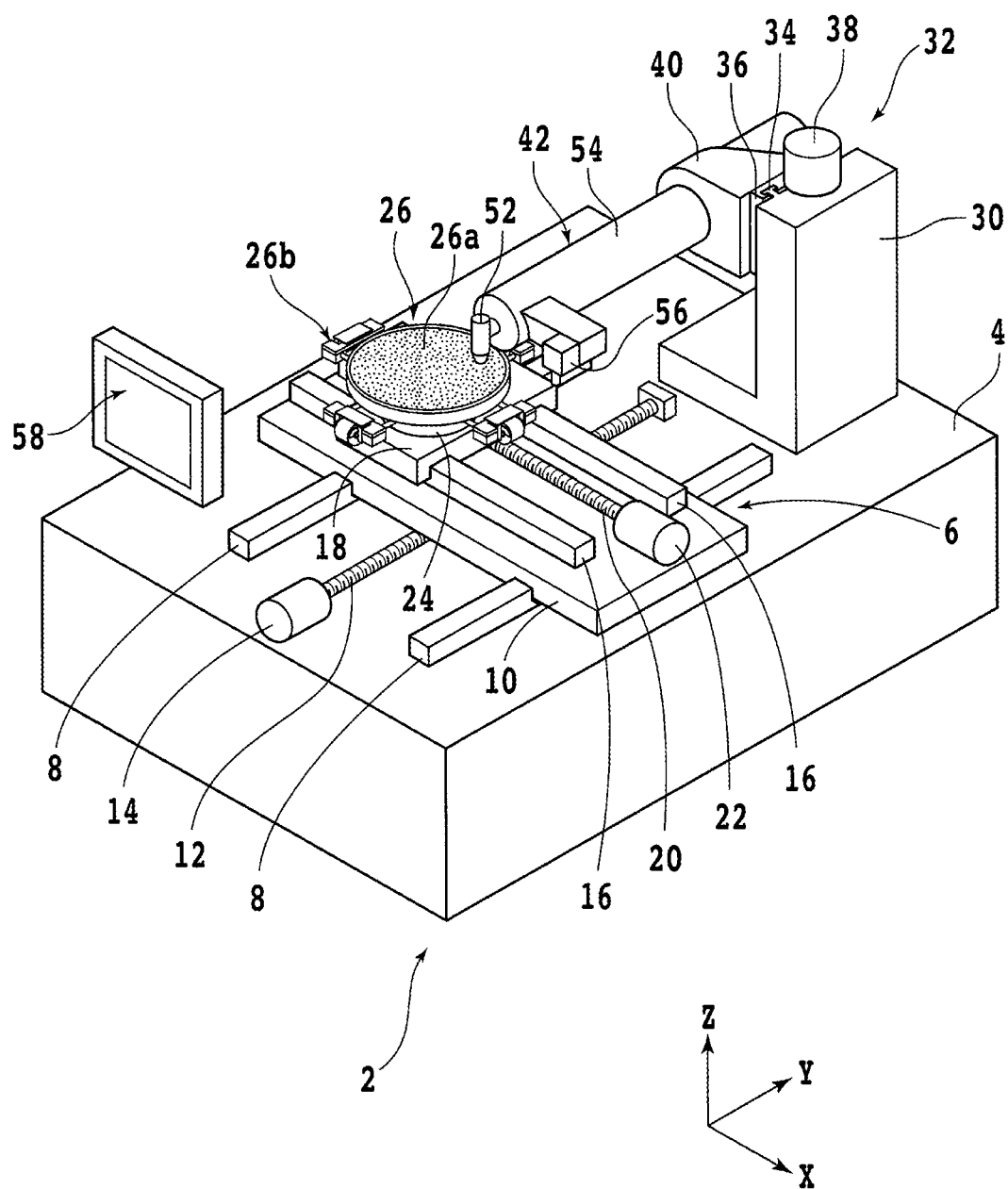
FIG. 2 is a perspective view that schematically illustrates a laser processing apparatus.

FIG. 2 is a perspective view that schematically illustrates a laser processing apparatus 2 used for laser processing of the wafer 11. An X-axis direction (i.e., a second direction) and a Y-axis direction (i.e., a first direction) illustrated in FIG. 2 are directions perpendicular to each other on a horizontal plane, and a Z-axis direction is a direction (i.e., a vertical direction) perpendicular to each of the X-axis direction and the Y-axis direction.

The laser processing apparatus 2 includes a base 4 that supports other components thereof. An X and Y-axis moving mechanism 6 is disposed on an upper surface of the base 4. The X and Y-axis moving mechanism 6 includes a pair of Y-axis guide rails 8 fixed to the upper surface of the base 4 and disposed along the Y-axis direction. On the upper side of the pair of Y-axis guide rails 8, a Y-axis moving plate 10 is fitted so as to be slidable along the pair of Y-axis guide rails 8. A ball screw is disposed on the lower side of the Y-axis moving plate 10.

The ball screw includes a nut portion (not illustrated) fixed to a lower surface of the Y-axis moving plate 10. A screw shaft 12 is coupled to the nut portion so as to be capable of rotating with use of balls (not illustrated). The screw shaft 12 is disposed along the Y-axis direction and between the pair of Y-axis guide rails 8. A motor 14 for rotating the screw shaft 12 is coupled to one end portion of the screw shaft 12. Once the motor 14 is driven, the Y-axis moving plate 10 moves along the Y-axis direction. The pair of Y-axis guide rails 8, the Y-axis moving plate 10, the screw shaft 12, the nut portion, the motor 14, and so on together form a Y-axis moving mechanism.

A pair of X-axis guide rails 16 are fixed to an upper surface of the Y-axis moving plate 10. The pair of X-axis guide rails 16 are disposed along the X-axis direction. On the upper side of the pair of X-axis guide rails 16, an X-axis moving plate 18 is fitted so as to be slidable along the pair of X-axis guide rails 16. A ball screw is disposed on the lower side of the X-axis moving plate 18. The ball screw includes a nut portion (not illustrated) fixed to a lower surface of the X-axis moving plate 18. A screw shaft 20 is coupled to the nut portion so as to be capable of rotating with use of balls (not illustrated). The screw shaft 20 is disposed along the X-axis direction and between the pair of X-axis guide rails 16. A motor 22 for rotating the screw shaft 20 is coupled to one end portion of the screw shaft 20. Once the motor 22 is driven, the X-axis moving plate 18 moves along the X-axis direction. The pair of X-axis guide rails 16, the X-axis moving plate 18, the screw shaft 20, the nut portion, the motor 22, and so on together form an X-axis moving mechanism. A columnar table base 24 is disposed on the upper side of the X-axis moving plate 18. The table base 24 includes a rotary drive source (not illustrated), such as a motor.

A disk-shaped chuck table 26 is disposed on a top portion of the table base 24. The rotary drive source is capable of causing the chuck table 26 to rotate about a straight rotation axis passing through a center of a holding surface 26a of the chuck table 26 and parallel to the Z-axis direction within a predetermined angular range. The chuck table 26 includes a disk-shaped frame made of a nonporous metal.

A disk-shaped recess (not illustrated) is defined in a center of the frame. A disk-shaped porous plate made of ceramic is fixed in the recess. A predetermined passage (not illustrated) is defined in the frame. A negative pressure is transferred from a suction source (not illustrated), such as an ejector, to an upper surface of the porous plate through the predetermined passage. An annular upper surface of the frame and the circular upper surface of the porous plate are substantially flush with each other, and together function as the holding surface 26a, which is substantially flat, for holding the wafer 11 under suction. In a state of being held under suction on the holding surface 26a, the wafer 11 can be moved by the X and Y-axis moving mechanism 6 along both the X-axis and Y-axis directions. At an outer circumferential portion of the chuck table 26, a plurality of (four in the present embodiment) clamp units 26b are disposed at substantially regular intervals along the circumferential direction of the chuck table 26. The clamp units 26b together hold a frame of a frame unit, which will be described below, placed therebetween.

A supporting structure 30 is disposed on a predetermined region of the base 4 located behind the X and Y-axis moving mechanism 6. A Z-axis moving mechanism 32 is disposed on a side surface of the supporting structure 30, the side surface extending along a Y-Z plane. The Z-axis moving mechanism 32 includes a pair of Z-axis guide rails 34. The pair of Z-axis guide rails 34 are fixed to the side surface of the supporting structure 30 and are disposed along the Z-axis direction. A Z-axis moving plate 36 is fitted to the pair of Z-axis guide rails 34 so as to be slidable along the pair of Z-axis guide rails 34. A ball screw (not illustrated) is disposed on a rear side of the Z-axis moving plate 36. The ball screw includes a nut portion (not illustrated) fixed to a rear surface of the Z-axis moving plate 36. A screw shaft (not illustrated) is coupled to the nut portion so as to be capable of rotating with use of balls. The screw shaft is disposed along the Z-axis direction and between the pair of Z-axis guide rails 34. A motor 38 for rotating the screw shaft is coupled to an upper end portion of the screw shaft. Once the motor 38 is driven, the Z-axis moving plate 36 moves along the Z-axis direction.

Figure 3:
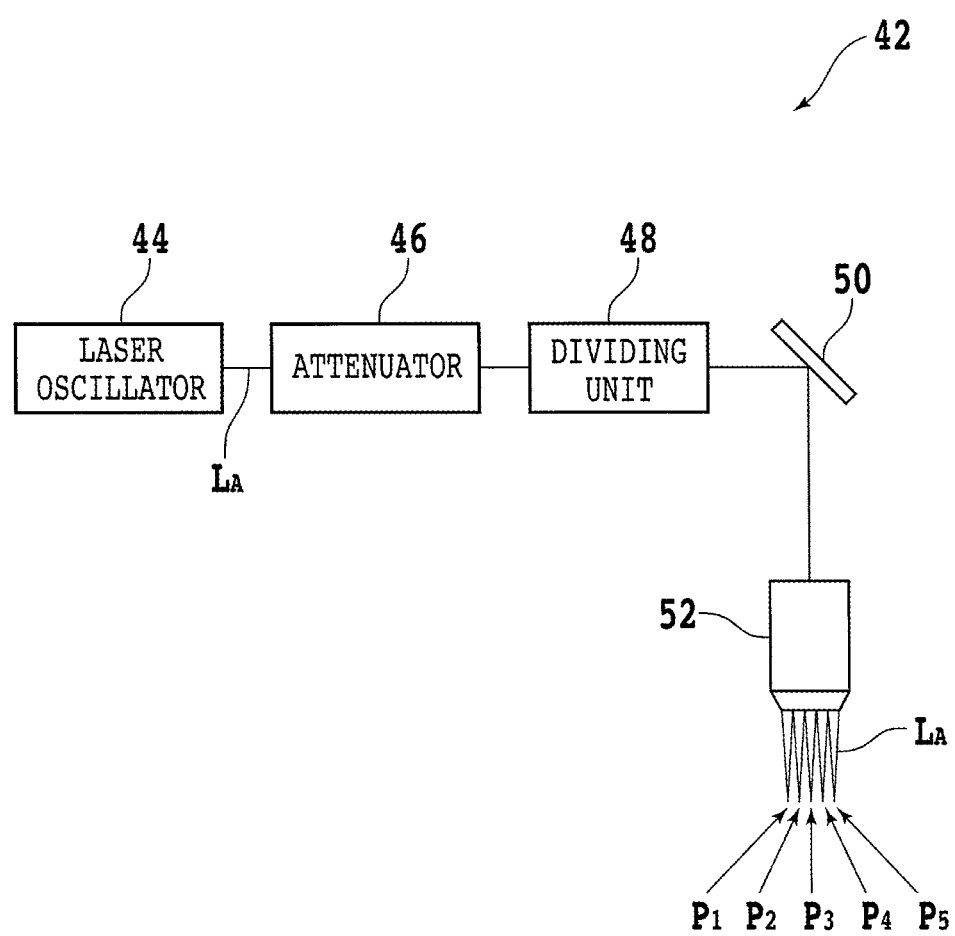
FIG. 3 is a block diagram that schematically illustrates the structure of a laser beam emitting unit.

A support 40 is fixed to a front surface of the Z-axis moving plate 36. The support 40 supports a portion of a laser beam emitting unit 42. FIG. 3 is a block diagram that schematically illustrates the structure of the laser beam emitting unit 42. In FIG. 3, some components of the laser beam emitting unit 42 are depicted as functional blocks. The laser beam emitting unit 42 includes a laser oscillator 44 fixed with respect to the base 4. The laser oscillator 44, for example, has Nd:YVO$_4$, Nd:YAG, or the like as a laser medium, and emits a pulsed laser beam L$_A$ having a wavelength (e.g., 1342 nm or 1064 nm) capable of penetrating the wafer 11.

The laser beam L$_A$ travels to a dividing unit 48 after power thereof is adjusted by an attenuator 46. The dividing unit 48 according to the present embodiment includes, for example, a diffractive optical element (DOE) and/or a spatial light modulator including a liquid crystal phase control element called a "liquid crystal on silicon—spatial light modulator" (LCOS-SLM). The dividing unit 48 has a function of dividing the laser beam L$_A$. For example, the dividing unit 48 divides the laser beam L$_A$ such that the laser beam L$_A$ emitted from an emission head 52 will form a plurality of focal points arranged at substantially regular intervals along the Y-axis direction.

While FIG. 3 illustrates an example case where the laser beam L$_A$ is divided by the dividing unit 48 such that five focal points P$_1$ to P$_5$ will be formed, it is sufficient if the laser beam L$_A$ is divided such that a predetermined number of focal points will be formed, the predetermined number being two or more (more preferably, in the range of 2 to 16 both inclusive). The dividing unit 48 also has a function of allowing the laser beam L$_A$ to simply pass therethrough without dividing the laser beam L$_A$. The laser beam L$_A$ can be arranged to be divided or left undivided by controlling an operation of the dividing unit 48. Note that the dividing unit 48 may include a diffraction grating in place of the LCOS-SLM. The diffraction grating divides the laser beam L$_A$ such that the predetermined number of focal points will be formed, and therefore, in a case where the laser beam L$_A$ is not to be divided, the diffraction grating may be eliminated from an optical path of the laser beam L$_A$. Also, note that the laser beam emitting unit 42 may not necessarily include the dividing unit 48.

The laser beam L$_A$ starting from the laser oscillator 44 is reflected by a mirror 50 to be guided to the emission head 52. A condensing lens (not illustrated) for collection and focusing of the laser beam L$_A$, etc. is housed in the emission head 52. At the time of laser processing, the emission head 52 is disposed so as to face the holding surface 26a, and the laser beam $L_A$ is emitted toward the holding surface 26a. The emission head 52 is disposed at a front end of a columnar housing 54 disposed in such a manner that the length thereof extends along the Y-axis direction (see FIG. 2). A portion of the housing 54 is supported by the support 40 near a rear end portion thereof. Moreover, an imaging unit 56 is fixed to a side surface of the housing 54 in the vicinity of the emission head 52 such that the imaging unit 56 is capable of facing the holding surface 26a.

The imaging unit 56 is, for example, a visible light camera unit including an objective lens, a light source, such as a light emitting diode (LED), and an imaging element, such as a charge-coupled device (CCD) image sensor or a complementary metal-oxide-semiconductor (CMOS) image sensor. In a case of the visible light camera unit, photodiodes using silicon (Si), for example, are used as the imaging element. Note that the imaging unit 56 may alternatively be an infrared camera unit including a light source, such as an LED, and an imaging element. In a case of the infrared camera unit, photodiodes using indium gallium arsenide (InGaAs), for example, are used as the imaging element. Use of the infrared camera unit makes it possible to image the first surface 11a from above the second surface 11b, with the wafer 11 intervening therebetween, even when the first surface 11a is held under suction on the holding surface 26a.

The emission head 52, the housing 54, the imaging unit 56, and so on are capable of moving together along the Z-axis direction through the Z-axis moving mechanism 32. A cover (not illustrated) that covers the above-described components is disposed on the base 4. A touchscreen panel 58 is disposed on a front surface of this cover. The touchscreen panel 58 functions as an input device, such as a capacitive touch sensor, and a display device, such as a liquid crystal display. An operator uses the touchscreen panel 58 to set processing conditions for the laser processing apparatus 2 and view an image of the wafer 11 obtained by the imaging unit 56.

The laser processing apparatus 2 is used to form a separation start position in the wafer 11. When the separation start position is formed in the wafer 11, the wafer 11 is first placed on the chuck table 26 with the second surface (i.e., the rear surface) 11b facing upward, and the wafer 11 is held under suction by the chuck table 26. Then, the focal point is positioned at a predetermined height within the wafer 11 by the laser beam emitting unit 42, and a laser beam emitted from above the second surface 11b of the wafer 11 is focused thereat to form a modified layer and a crack extending from the modified layer. The modified layer and the crack together function as the separation start position (i.e., a peeling layer). Then, an external force is applied to the wafer 11 to separate the wafer 11 into upper and lower pieces at the separation start position, resulting in efficient thinning of the wafer 11.

However, components (i.e., stray light) of the laser beam emitted from the laser beam emitting unit 42 onto the wafer 11 which have not contributed to the formation of the separation start position and have not been absorbed by the wafer 11 travel through the wafer 11 to reach the first surface 11a. Since the devices 17 are formed on the first surface 11a, the devices 17 may be damaged by these components (i.e., the stray light) of the laser beam. Accordingly, to prevent damage to the devices 17, there has been a need to limit the power of the laser beam for forming the separation start position. To form a high-quality separation start position using a low-intensity laser beam, laser processing takes a long time, resulting in a failure to form a separation start position with high efficiency.

In addition, to prevent damage to the devices 17, there has been a need to set the focal point of the laser beam at a predetermined distance or more from the first surface 11a. In this case, after the wafer 11 is separated into the upper and lower pieces at the separation start position and the separated upper piece including the second surface 11b is removed, a large portion of the wafer 11 needs to be cut off in a grinding step, which is performed to thin the wafer 11 to a predetermined finish thickness. This leads to heavy wear of grindstones included in a grinding wheel used for the grinding, and to a need to frequently replace the grinding wheel, resulting in poor economy.

Accordingly, in the wafer processing method and the device chip manufacturing method according to the present embodiment, a protective layer is formed in the wafer 11 before the formation of the separation start position so as to enable efficient thinning of the wafer 11 having the devices 17 arranged on the first surface 11a thereof. In this case, the laser beam emitted onto the wafer 11 when the separation start position is formed impinges on the protective layer, and the laser beam is, for example, reflected, attenuated, and diffused by the protective layer. This leads to a reduced likelihood of damage to the devices 17, allowing the laser beam to be emitted onto the wafer 11 with more intensive irradiation conditions. Moreover, it is made possible to form the separation start position closer to the first surface 11a. In this case, the amount of grinding of the wafer 11 is reduced, resulting in reduced wear of the grindstones and an extended life of the grindstones. Moreover, the time required for the grinding is also reduced, resulting in more efficient processing of the wafer 11 and more efficient manufacture of the device chips.

Figure 10:
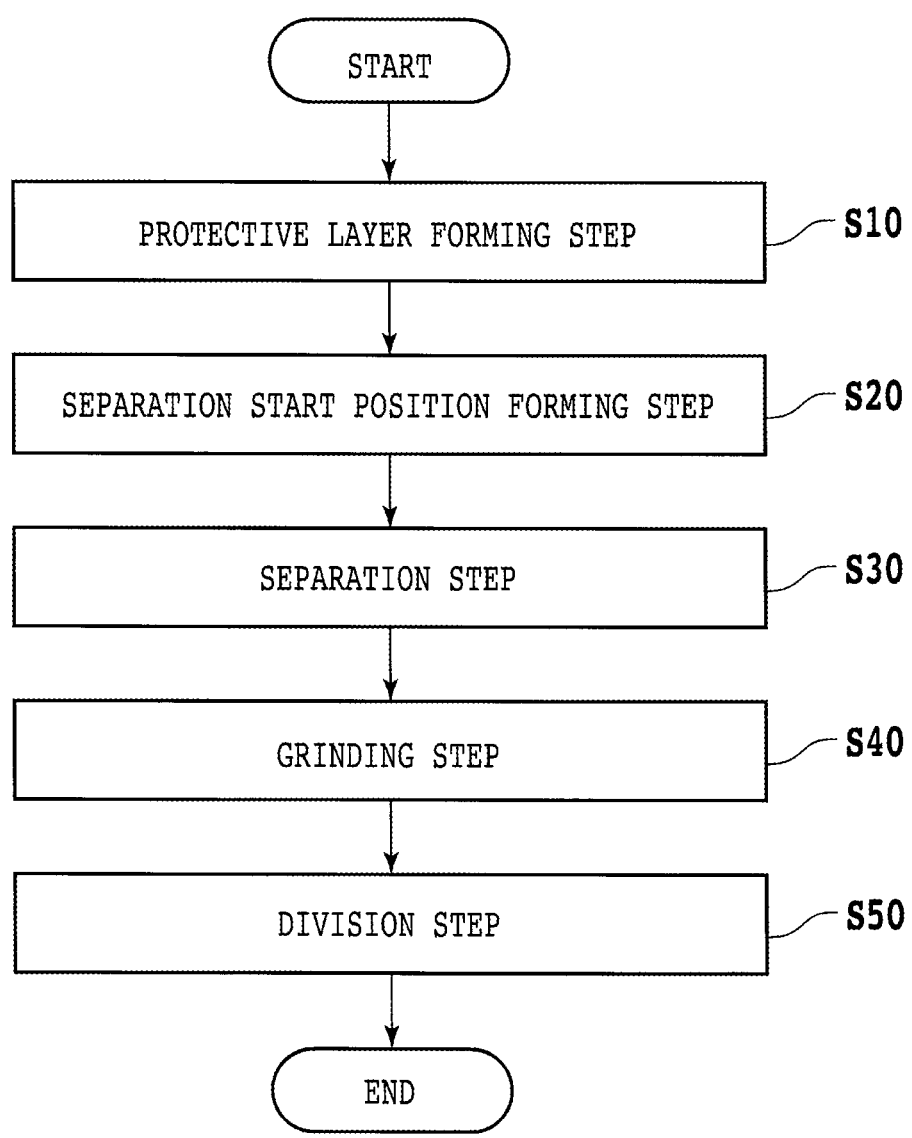
FIG. 10 is a flowchart illustrating a flow of steps of a wafer processing method and a device chip manufacturing method.

Hereinafter, steps of the wafer processing method and the device chip manufacturing method according to the present embodiment will be described in detail. Note that, in the wafer processing method and the device chip manufacturing method according to the present embodiment, some of the steps described below may be omitted, and a step or steps other than the steps described below may be additionally performed. Here, the wafer processing method according to the present embodiment is embraced in the device chip manufacturing method. Thus, the steps of the device chip manufacturing method will be described below. FIG. 10 is a flowchart illustrating a flow of the steps of the device chip manufacturing method according to the present embodiment.

Figure 4:
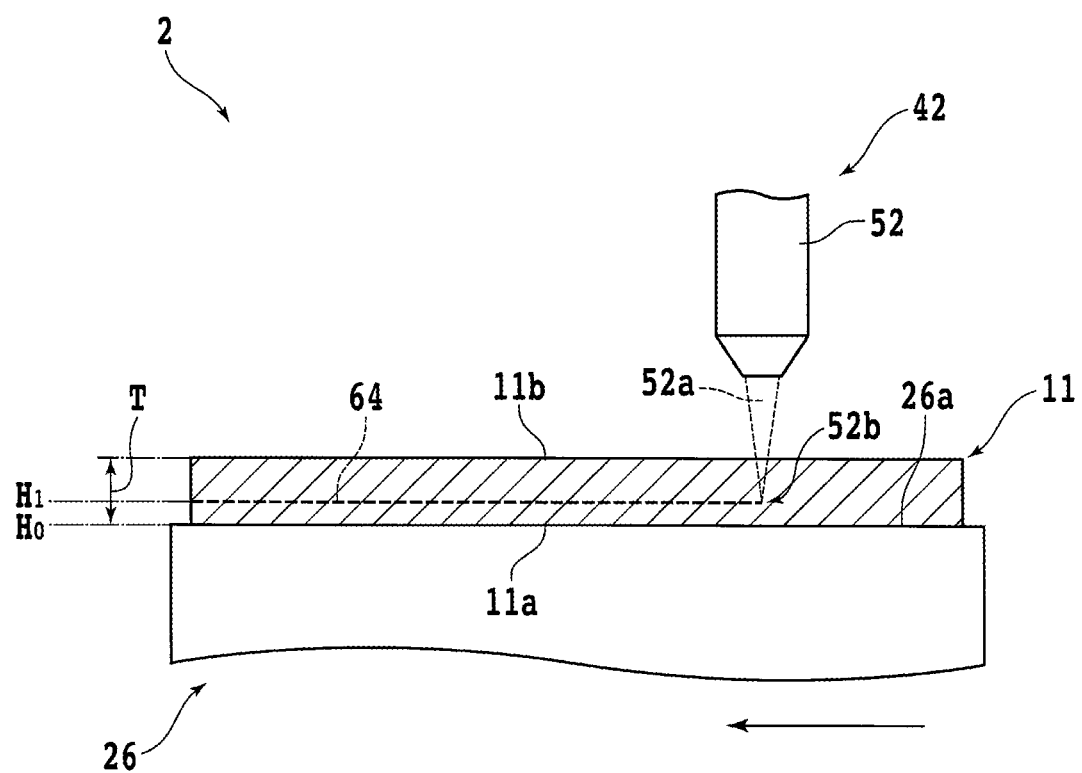
FIG. 4 is a sectional view that schematically illustrates the wafer in a protective layer forming step.

In the device chip manufacturing method according to the present embodiment, a protective layer forming step S10 of forming the protective layer in the wafer 11 is performed before a separation start position forming step S20 of forming the separation start position in the wafer 11 is performed. Each of the protective layer forming step S10 and the separation start position forming step S20 is performed using, for example, the above-described laser processing apparatus 2. FIG. 4 is a sectional view that schematically illustrates how the protective layer forming step S10 is performed.

When the protective layer forming step S10 is started, the wafer 11 is first placed on the chuck table 26. Then, after the wafer 11 is placed on the chuck table 26, the wafer 11 is held under suction by the chuck table 26. Here, the wafer 11 is placed on the chuck table 26 such that the first surface 11a of the wafer 11, with the devices 17 formed thereon, faces the holding surface 26a of the chuck table 26 while the second surface 11b of the wafer 11 is exposed upwardly. This is because the laser beam should not be emitted onto the wafer 11 from the side on which the first surface 11a lies, to prevent the laser beam from directly impinging on any of the devices 17 formed on the first surface 11a.

Note that a protective tape or the like for protecting the devices 17 may be attached to the first surface 11a of the wafer 11 in advance. Moreover, this protective tape may be disposed on the wafer 11 while having a diameter greater than the diameter of the wafer 11, and an outer circumferential portion of the protective tape may be attached to a ring frame. In this case, the ring frame is fixed by the clamp units 26b of the chuck table 26. Note that, in each of the sectional views in the accompanying drawings, the devices 17 formed on the first surface 11a and the protective tape or the like attached to the first surface 11a are omitted.

In the protective layer forming step S10, next, the laser beam emitting unit 42 and the chuck table 26 are lifted or lowered relative to each other along the Z-axis direction. The height of a first focal point 52b, which is a focal point of a first laser beam 52a to be emitted from the laser beam emitting unit 42 onto the wafer 11 in the protective layer forming step S10, is thus adjusted. Then, the first focal point 52b of the first laser beam 52a is positioned at a first height $H_1$ within the wafer 11. The first height $H_1$ will be described in detail below.

Next, the emission head 52 of the laser beam emitting unit 42 and the chuck table 26 are moved relative to each other along the horizontal plane, extending in both the X-axis direction and the Y-axis direction, whereby the first focal point 52b and the wafer 11 are moved relative to each other along the first surface 11a. That is, processing feed is started. In addition, while the first focal point 52b and the wafer 11 are moved relative to each other, the laser beam emitting unit 42 is driven to emit the first laser beam 52a, which has a wavelength capable of penetrating the wafer 11, onto the wafer 11 from the side on which the second surface 11b lies.

When the first laser beam 52a having a wavelength capable of penetrating the wafer 11 is focused at the first focal point 52b within the wafer 11, a part of the first laser beam 52a is absorbed by the wafer 11 to modify the wafer 11 in the vicinity of the first focal point 52b, thereby forming a protective layer 64. The protective layer (i.e., a modified layer) 64 has a function of protecting the devices 17 formed on the first surface 11a against a second laser beam to be emitted onto the wafer 11 in the separation start position forming step S20, which will be described next.

Irradiation conditions for the first laser beam 52a emitted onto the wafer 11 in the protective layer forming step S10 will be described below along with irradiation conditions for the second laser beam to be emitted onto the wafer 11 in the separation start position forming step S20, which will be described next.

Figure 5:
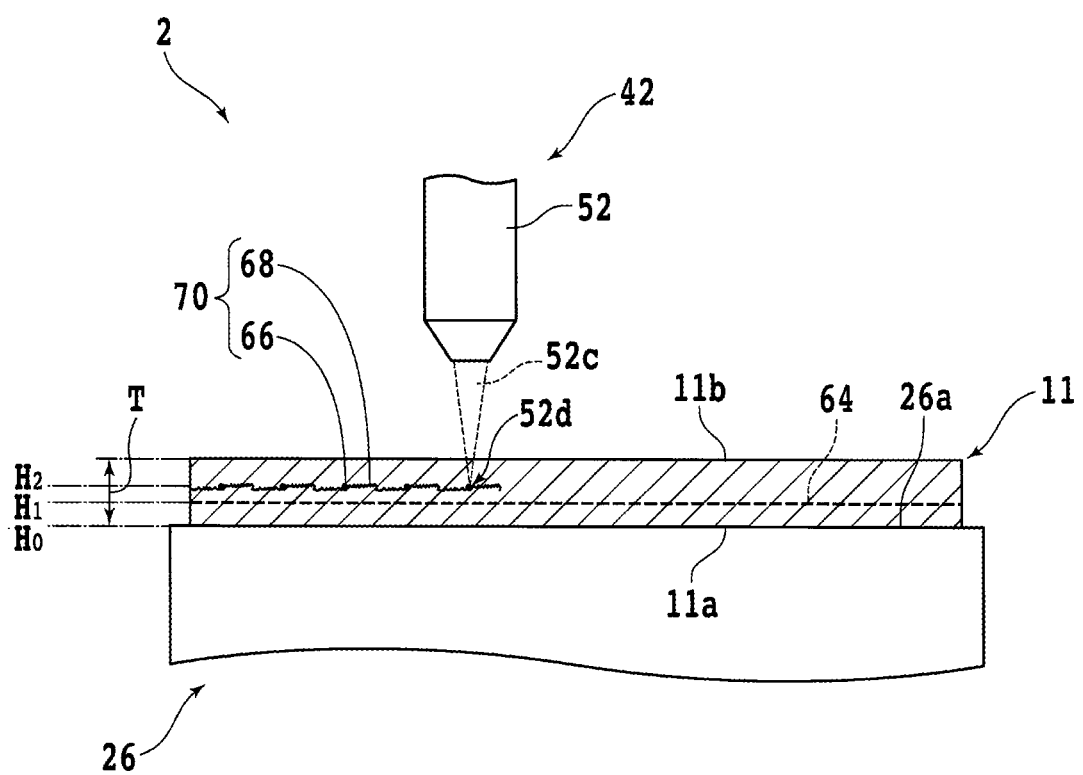
FIG. 5 is a sectional view that schematically illustrates the wafer in a separation start position forming step.

In the device chip manufacturing method according to the present embodiment etc., after the protective layer forming step S10, the separation start position forming step S20 of forming the separation start position, made up of the modified layer and the crack, in the wafer 11 is performed. FIG. 5 is a sectional view that schematically illustrates how the separation start position forming step S20 is performed. In a case where the separation start position forming step S20 is performed using the laser processing apparatus 2 after the protective layer forming step S10, the wafer 11 is continuously held under suction by the chuck table 26.

In the separation start position forming step S20, the laser beam emitting unit 42 and the chuck table 26 are lifted or lowered relative to each other along the Z-axis direction. The height of a second focal point 52d, which is a focal point of a second laser beam 52c to be emitted from the laser beam emitting unit 42 onto the wafer 11 in the separation start position forming step S20, is thus adjusted. In this adjustment, the second focal point 52d of the second laser beam 52c is positioned at a second height $H_2$ higher than the first height $H_1$ within the wafer 11.

Next, the emission head 52 of the laser beam emitting unit 42 and the chuck table 26 are moved relative to each other along the horizontal plane, whereby the second focal point 52d and the wafer 11 are moved relative to each other along the first surface 11a. That is, processing feed is started. In addition, while the second focal point 52d and the wafer 11 are moved relative to each other, the laser beam emitting unit 42 is driven to emit the second laser beam 52c, which has a wavelength capable of penetrating the wafer 11, onto the wafer 11 from the side on which the second surface 11b lies. When the second laser beam 52c having a wavelength capable of penetrating the wafer 11 is focused at the second focal point 52d within the wafer 11, a part of the second laser beam 52c is absorbed by the wafer 11 to modify the wafer 11 in the vicinity of the second focal point 52d, thereby forming a modified layer 66. Further, a crack 68 extending from the modified layer 66 is formed at the same time. This modified layer 66 and the crack 68 together form a separation start position 70.

Here, the irradiation conditions for the second laser beam 52c may be set such that the wafer 11 will be processed with greater intensity than with the first laser beam 52a. Note, however, that the intensity of the first laser beam 52a and the intensity of the second laser beam 52c are not limited to the above example. In addition, the first laser beam 52a and the second laser beam 52c may have the same wavelength, and both may be emitted through the emission head 52 of the same laser beam emitting unit 42. In this case, a difference in a parameter other than the wavelength is provided between the irradiation conditions for the two laser beams.

In the device chip manufacturing method according to the present embodiment etc., after the separation start position forming step S20, a separation step S30 of applying an external force to the wafer 11 to divide the wafer 11 at the separation start position 70 and separating a piece including the second surface 11b from the wafer 11 is performed.

Figure 6A:
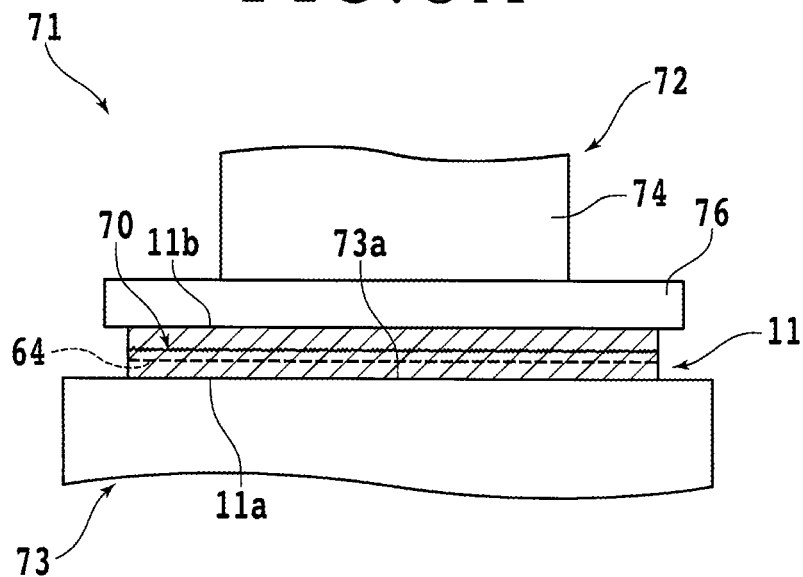
FIG. 6A is a sectional view that schematically illustrates the wafer in a separation step.
Figure 6B:
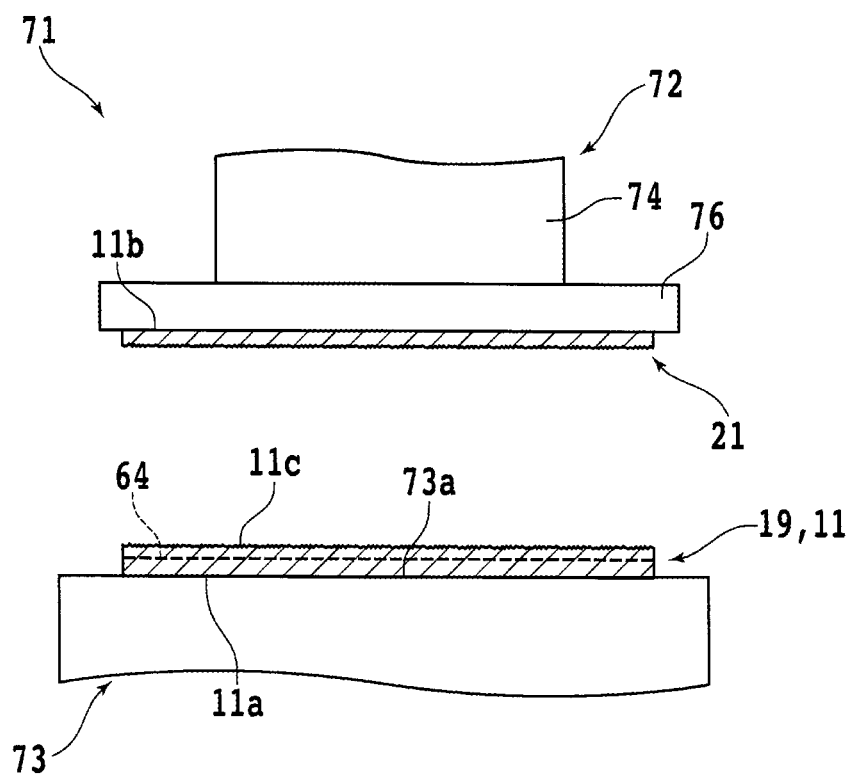
FIG. 6B is a sectional view that schematically illustrates the wafer in the separation step.

Each of FIGS. 6A and 6B includes a sectional view that schematically illustrates the wafer 11 when the separation step S30 is performed. The separation step S30 is performed, for example, in a separation apparatus 71 illustrated in FIGS. 6A and 6B. The separation apparatus 71 includes a holding table 73 that holds the wafer 11 with the separation start position (i.e., the peeling layer) 70 formed therein. The holding table 73 includes a circular upper surface (i.e., a holding surface) 73a, and a porous plate (not illustrated) is exposed on the holding surface 73a. Further, this porous plate is in communication with a suction source (not illustrated), such as a vacuum pump, through a passage or the like defined in the holding table 73. Then, when this suction source is in operation, a negative pressure is generated in a space in the vicinity of the holding surface 73a of the holding table 73.

In addition, a separation unit 72 is provided over the holding table 73. The separation unit 72 includes a columnar support member 74. A lifting and lowering mechanism (not illustrated) using a ball screw, for example, is coupled to an upper portion of the support member 74. Then, this lifting and lowering mechanism is caused to operate to lift and lower the separation unit 72. In addition, a lower end portion of the support member 74 is fixed to a center of an upper portion of a disk-shaped base 76. The separation unit 72 includes an internal suction mechanism (not illustrated) to cause a negative pressure to act on a lower surface of the base 76 and is capable of functioning as a suction pad.

In the separation apparatus 71, the separation step S30 is performed, for example, according to the following procedure. Specifically, the wafer 11 with the separation start position 70 formed therein is first placed on the holding surface 73a of the holding table 73 such that the second surface 11b is exposed upwardly. At this time, the first surface 11a faces the holding surface 73a. Next, the suction source connected to the holding table 73 is driven to cause the wafer 11 to be held under suction by the holding table 73.

Next, the lifting and lowering mechanism of the separation unit 72 is driven to lower the separation unit 72 from above the holding table 73, thereby bringing the lower surface of the base 76 into contact with the second surface 11b of the wafer 11. FIG. 6A schematically illustrates the situation in which the lower surface of the base 76 is in contact with the second surface 11b of the wafer 11.

In the separation step S30, an external force is applied to the wafer 11 just before or after the base 76 is brought into contact with the wafer 11, or at the same time as this contact. Once the external force is applied to the wafer 11, the crack 68 included in the separation start position 70, for example, extends to separate the wafer 11 into a piece including the first surface 11a and a piece including the second surface 11b at the separation start position 70. The separation of the wafer 11 at the separation start position 70 results in a separated piece 21 including the second surface 11b, leaving a thinned wafer 19 including the first surface 11a.

The separated piece 21 can be removed from the thinned wafer 19 by causing a negative pressure (i.e., a suction force) to act on the separated piece 21 from the base 76 of the separation unit 72, thereby causing the separated piece 21 to be held under suction by the base 76, and driving the lifting and lowering mechanism of the separation unit 72 to lift the separation unit 72. Alternatively, the base 76 of the separation unit 72 is brought into contact with the wafer 11 before the separation and a negative pressure is caused to act on the wafer 11 from the base 76, and thereafter, the separation unit 72 is caused to lift. In this case, an external force lifting the wafer 11 is applied to the wafer 11, so that the wafer 11 is separated with the separation start position 70 serving as a start position, and the separated piece 21 is lifted, leaving the thinned wafer 19. FIG. 6B is a sectional view that schematically illustrates the wafer 11, 19 and the separated piece 21 when the separated piece 21 is removed therefrom.

Here, the external force applied to the wafer 11 in the separation step S30 will be described below. As the external force, ultrasonic vibration, for example, is applied to the wafer 11. In this case, for example, an ultrasonic vibrator including a piezoelectric element etc. may be incorporated in the separation unit 72 of the separation apparatus 71, and as the external force, ultrasonic vibration may be applied to the wafer 11 through the base 76. Also, the external force may be applied to the wafer 11 as a result of the base 76 being lifted while holding the wafer 11 under suction. In this case, an external force acting to lift the wafer 11 is applied to the wafer 11.

Note that the external force applied to the wafer 11 and the method for applying the external force to the wafer 11 are not limited to the above examples. For example, claw-shaped or wedge-shaped insertion members (not illustrated) may be laterally inserted into the wafer 11 to apply an external force to the wafer 11, and the separation of the wafer 11 may be caused by the external force applied by the insertion members. In this case, distal ends of the insertion members are positioned at the second height $H_2$ of the wafer 11 (see FIG. 5, etc.), and the insertion members are laterally inserted into the wafer 11. This promotes development of the crack 68 of the separation start position 70 from the outer circumferential portion of the wafer 11, leading to the separation of the wafer 11 at the entire separation start position 70 into the upper and lower pieces. In this case, it is convenient if the insertion members are disposed at an outer circumferential portion of the base 76 of the separation unit 72.

Note that the separation step S30 may not necessarily be performed using the dedicated separation apparatus 71 as illustrated in FIGS. 6A and 6B. For example, the laser processing apparatus 2 may be provided with the separation unit 72, and the separation step S30 may be performed following the separation start position forming step S20, with the wafer 11 still placed on the chuck table 26 of the laser processing apparatus 2. In this case, the chuck table 26 serves as the holding table 73 of the separation apparatus 71.

The thinned wafer 19 can be easily obtained when the separation start position 70 is formed in the wafer 11, the external force is applied to the wafer 11 to cause the separation of the wafer 11, and the separated piece 21 including the second surface 11b is removed therefrom. At this time, the second surface 11b is eliminated from the thinned wafer 19. Here, an exposed surface of the thinned wafer 19 on the side opposite to the first surface 11a is defined as a rear surface 11c. When the wafer 11 is thinned in the above-described manner, resulting in the thinned wafer 19, the volume of a portion of the wafer 19 which is removed in grinding that is performed when the wafer 19 is thinned to a final finish thickness in a grinding step S40, which will be described next, is very small.

In the device chip manufacturing method according to the present embodiment, etc., after the separation step S30 is performed, the grinding step S40, which grinds the rear surface 11c of the thinned wafer 11 (i.e., the wafer 19) exposed on the side opposite to the first surface 11a, is performed. In the grinding step S40, the rear surface 11c of the thinned wafer 11 (i.e., the wafer 19) is ground to flatten the rear surface 11c and thin the wafer 11 to the final finish thickness. At this time, the protective layer 64, which has been formed in the wafer 11 in the protective layer forming step S10 and which is left in the thinned wafer 19, is removed.

Figure 7:
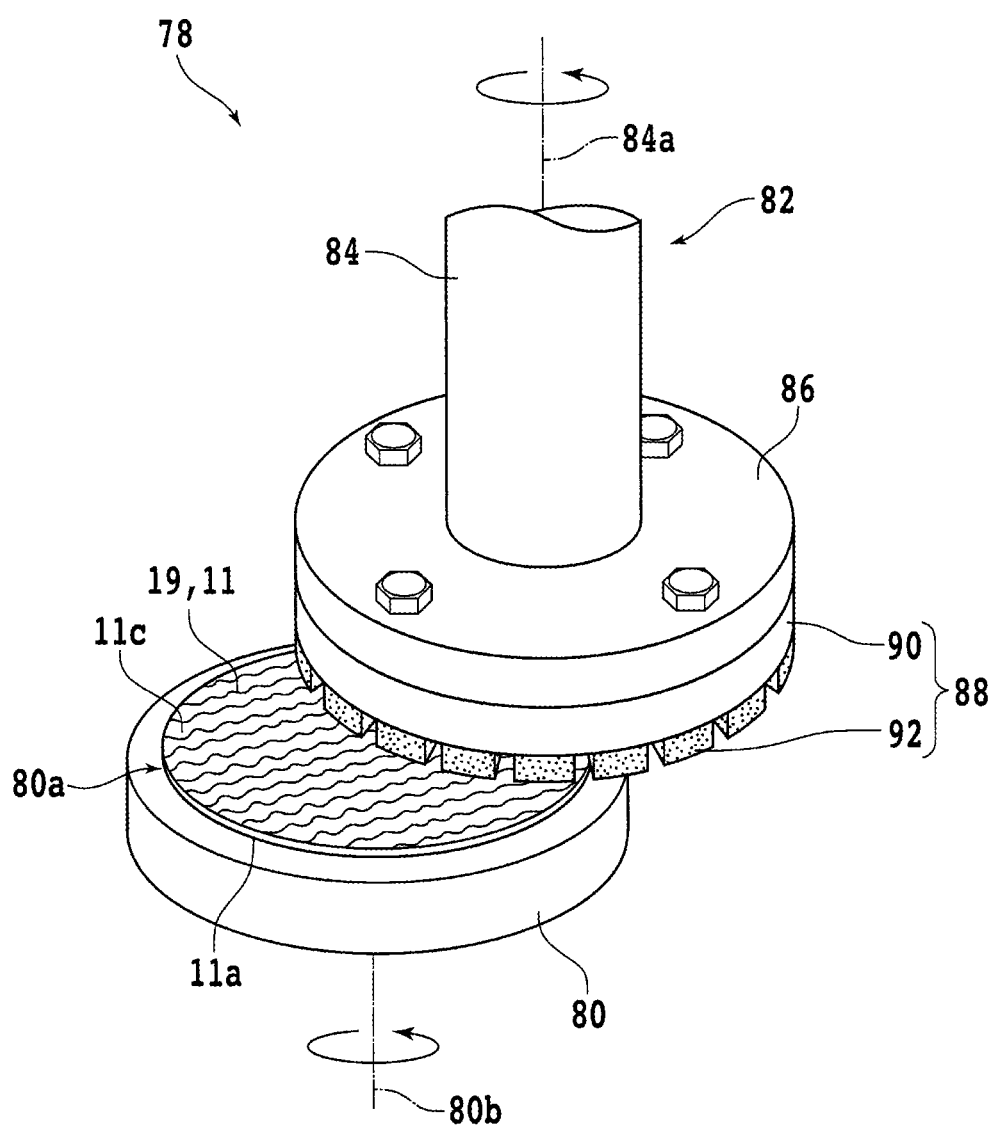
FIG. 7 is a perspective view that schematically illustrates the wafer in a grinding step.
Figure 8:
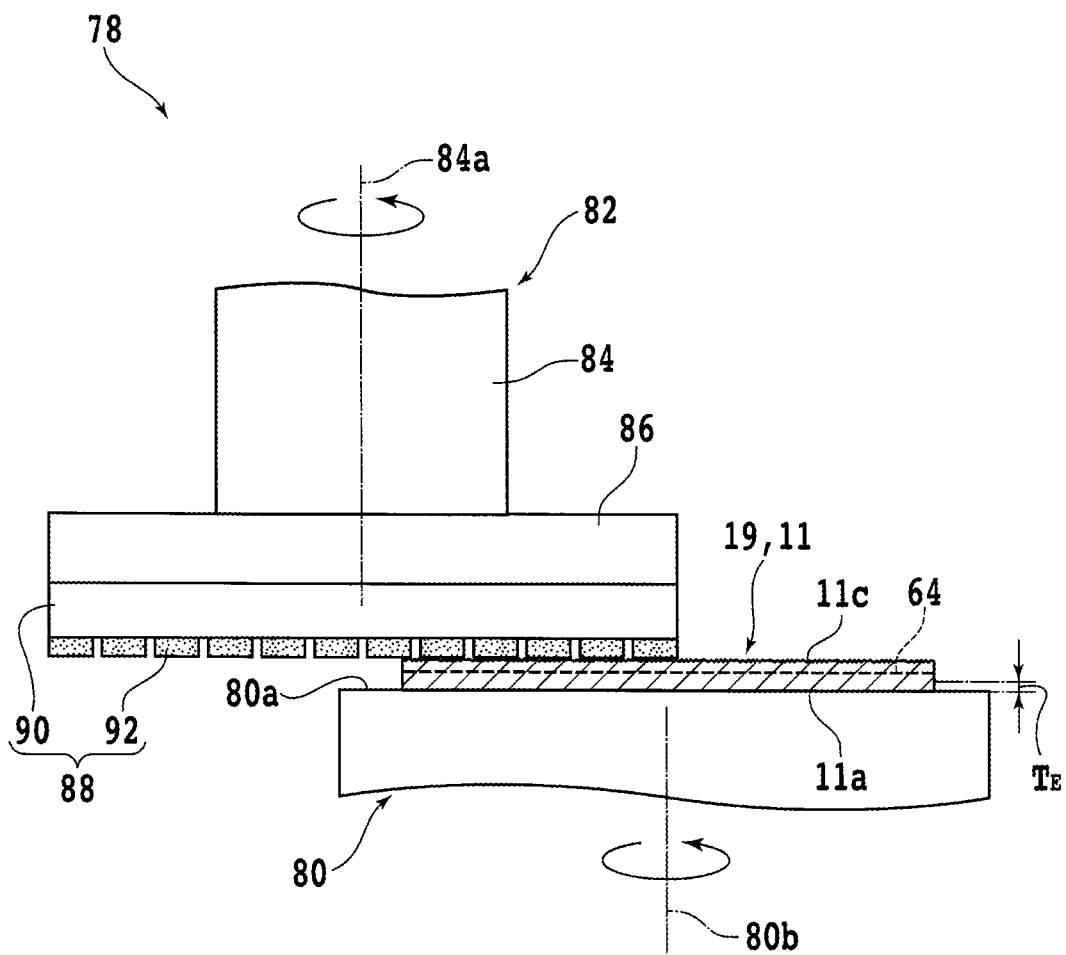
FIG. 8 is a sectional view that schematically illustrates the wafer being ground.

FIG. 7 is a perspective view that schematically illustrates how the grinding step S40 is performed. FIG. 8 is a sectional view that schematically illustrates how the grinding step S40 is performed. In FIGS. 7 and 8, some portions of a grinding apparatus 78 used to perform the grinding step S40 are schematically illustrated. Here, the grinding apparatus 78, which grinds the thinned wafer 11 (i.e., the wafer 19), will be described below.

The grinding apparatus 78 includes a disk-shaped chuck table 80. The chuck table 80 includes a disk-shaped frame made of nonporous ceramic. A disk-shaped recess (not illustrated) is defined in a center of the frame. A disk-shaped porous plate made of ceramic is fixed in this recess. A predetermined passage (not illustrated) is defined in the frame. A negative pressure is transferred from a suction source (not illustrated), such as an ejector, to an upper surface of the porous plate through the predetermined passage. The upper surface of the porous plate is conical in shape, with a central portion thereof slightly projecting relative to an outer circumferential portion thereof. The circular upper surface of the porous plate and an annular upper surface of the frame are substantially flush with each other, and together function as a substantially flat holding surface 80a for holding the wafer 11 under suction.

An annular and plate-shaped table base (not illustrated) that rotatably supports the chuck table 80 is provided under the chuck table 80. In addition, an inclination adjustment mechanism (not illustrated) that adjusts the inclination of the chuck table 80 is provided under the table base. Further, a spindle that forms a rotation axis 80b is coupled to a lower portion of the chuck table 80. A rotary drive source (not illustrated), such as a motor, is coupled to the spindle through a pulley, a belt, etc. Once the rotary drive source is driven, the chuck table 80 rotates about the rotation axis 80b.

A grinding unit 82 is disposed over the chuck table 80. The grinding unit 82 includes a cylindrical spindle housing (not illustrated) having a length extending substantially parallel to the vertical direction. A processing feed mechanism (not illustrated) using a ball screw to move the grinding unit 82 along a predetermined direction (e.g., the vertical direction) is coupled to the spindle housing. In addition, a portion of a columnar spindle 84 is rotatably housed in the spindle housing. A rotary drive source, such as a motor, is provided at an upper end portion of the spindle 84. A disk-shaped mount 86 is fixed to a lower end portion of the spindle 84. An annular grinding wheel 88 is attached to a lower surface of the mount 86.

The grinding wheel 88 includes a base 90 made of an aluminum alloy. The base 90 is disposed such that an upper surface thereof is in contact with the mount 86. On a lower surface of the base 90, a plurality of grindstones 92 are disposed at substantially regular intervals along the circumferential direction of the base 90. Each grindstone 92 includes, for example, a binder, such as metal, ceramic, or resin, and abrasive grains of diamond, cubic boron nitride (cBN), or the like. Abrasive grains having a relatively large average particle size are used in coarse grindstones, while abrasive grains having a relatively small average particle size are used in finishing grindstones. Once the spindle 84 is caused to start rotating, an annular grinding surface is formed by loci of lower surfaces of the plurality of grindstones 92. The grinding surface is a flat surface perpendicular to the longitudinal direction of the spindle 84. FIG. 8 illustrates the grinding step S40. Note that, in FIG. 8, the protective tape etc. are omitted.

In the grinding step S40, first, the first surface 11a of the wafer 19 (i.e., the thinned wafer 11) is held under suction by the holding surface 80a of the chuck table 80 with the protective tape intervening between the first surface 11a and the holding surface 80a. Next, the table base is tilted such that a portion of the holding surface 80a of the chuck table 80 will be substantially parallel to the grinding surface of the grinding wheel 88. In this situation, the chuck table 80 is caused to start rotating about the rotation axis 80b at a predetermined rotation speed (e.g., 200 rpm), and the grinding wheel 88 is caused to start rotating about a rotation axis 84a at a predetermined rotation speed (e.g., 3000 rpm). Further, the grinding unit 82 is moved downward (i.e., processing feed is performed) at a predetermined processing feed rate (e.g., 1.0 μm/s) while a grinding fluid, such as pure water, is fed from a grinding fluid feed nozzle (not illustrated) to a region of contact between the grinding surface and the rear surface 11c of the wafer 19. The rear surface 11c is ground through contact of grinding surfaces of the grindstones 92 with the rear surface 11c. The processing feed is continued until the wafer 19 is thinned to the predetermined finish thickness.

The grinding step S40 may be performed in two stages, coarse grinding and finish grinding. That is, in this case, coarse grinding of the rear surface 11c is performed using a grinding unit 82 (i.e., a coarse grinding unit) having coarse grindstones as the grindstones 92, and thereafter, the finish grinding of the rear surface 11c is performed using another grinding unit 82 (i.e., a finish grinding unit) having finishing grindstones as the grindstones 92. Further, after the finish grinding, polishing of the rear surface 11c may be performed using a polishing unit (not illustrated). The polishing unit includes a spindle 84, and a polishing pad attached to one end portion of the spindle 84. Performing the polishing, in addition to the coarse grinding and the finish grinding, leads to improved flexural strength of the device chips finally manufactured.

In particular, the finish thickness $T_E$ of the wafer 19 obtained after completion of the grinding step S40 is smaller than the distance between the first surface 11a and the first height $H_1$ at which the protective layer 64 is formed. In other words, the first height $H_1$ is set such that the distance between the first surface 11a and the first height $H_1$ is greater than the finish thickness $T_E$. In this case, the protective layer 64 formed in the wafer 19 is removed by the grinding before the thickness of the wafer 19 is reduced to the finish thickness $T_E$ in the grinding step S40.

If the protective layer 64 is left in the wafer 19 after the grinding step S40, the protective layer 64 will be left in the device chips obtained by dividing the wafer 19 as well. If some shock is applied to any of the device chips including the protective layer 64 as a modified layer, a crack can easily extend from the protective layer 64 to cause damage to the device chip. In contrast, when the protective layer 64 is removed in the grinding step S40, the protective layer 64 is not left in the device chips finally manufactured, and the device chips have higher strength.

In the present embodiment, the wafer 19, which has been thinned by the separation of the separated piece 21, is ground, and therefore, the amount of grinding of the wafer 19, 11 is lower than that in a case where the wafer 11, which has the separated piece 21 remaining therein, is ground from the second surface 11b. This leads to a significant reduction in the amount of wear of the grindstones 92.

A metal film, a resin film, or the like may be formed on the first surface 11a or the rear surface 11c of the thinned wafer 19 after the grinding step S40. When the wafer 19 is thereafter finally divided along the planned dividing lines 15 (see FIG. 1), the individual device chips are obtained. In the device chip manufacturing method according to the present embodiment, after the grinding step S40 is performed, a division step S50 of dividing the wafer 19 into pieces each having one of the devices 17, thereby manufacturing the plurality of device chips each provided with one of the devices 17, is performed.

The division of the wafer 19 may be performed, for example, by cutting the wafer 19 through an annular cutting blade in a cutting apparatus including the cutting blade. Alternatively, the division of the wafer 19 may be performed by subjecting the wafer 19 to laser processing in the laser processing apparatus 2 illustrated in FIG. 2. The division step S50 will be described below with reference to an example case where the cutting apparatus including the cutting blade is used, but the device chip manufacturing method according to the present embodiment is not limited to this example.

Figure 9:
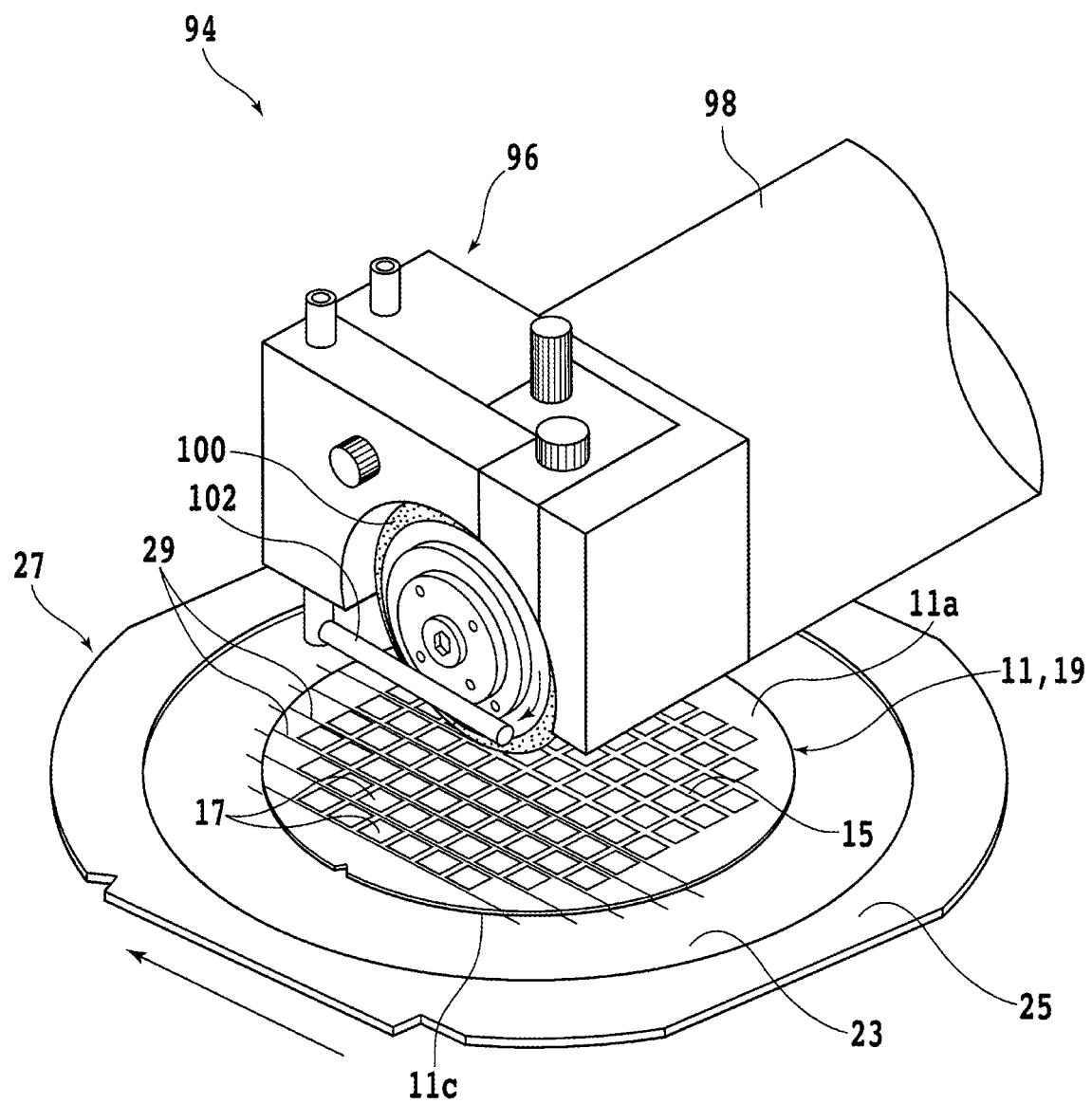
FIG. 9 is a perspective view that schematically illustrates the wafer being divided.

FIG. 9 is a perspective view that schematically illustrates the wafer 19 in the process of being cut and divided by a cutting apparatus 94. As illustrated in FIG. 9, a dicing tape 23 is preferably attached onto the rear surface 11c of the wafer 19 before the wafer 19 is loaded onto the cutting apparatus 94, and a ring frame 25 is preferably attached to an outer circumferential portion of the dicing tape 23. That is, the wafer 19 is preferably integrated with the dicing tape 23 and the ring frame 25 in advance to form a frame unit 27 including the wafer 19, the dicing tape 23, and the ring frame 25. In this case, handling of the thinned wafer 19 is facilitated, and handling of the device chips is also facilitated because the device chips manufactured are supported by the dicing tape 23.

Note that, in a case where the protective tape or the like for protecting the devices 17 has been attached to the first surface 11a of the wafer 19, the protective tape is preferably peeled off before the frame unit 27 is loaded onto the cutting apparatus 94 after the frame unit 27 is formed. When the wafer 19 has the dicing tape 23 attached thereto, peeling the protective tape off from the thinned wafer 19 is relatively easy.

First, the cutting apparatus 94 will be described below. The cutting apparatus 94 includes a chuck table (not illustrated) having a structure similar to that of the chuck table 26 of the laser processing apparatus 2. An upper surface of the chuck table of the cutting apparatus 94 forms a holding surface that holds the wafer 19 under suction with the dicing tape 23 intervening therebetween. This holding surface is in communication with a suction source (not illustrated), such as an ejector, through a suction passage (not illustrated) or the like provided inside the chuck table. A plurality of clamps (not illustrated) for holding the ring frame 25, which supports the wafer 11, 19, from all four sides are provided around the chuck table. Also in the cutting apparatus 94, the chuck table is coupled to a rotary drive source (not illustrated), such as a motor, and rotates about a rotation axis substantially parallel to the vertical direction. In addition, processing feed of the chuck table is performed through a moving mechanism (i.e., a processing feed unit).

The cutting apparatus 94 includes a cutting unit 96 disposed over the chuck table. The cutting unit 96 includes an annular cutting blade 100 and cuts the wafer 19 through the cutting blade 100. The cutting unit 96 includes a spindle housing 98 that houses a proximal portion of a spindle (not illustrated) forming a rotation axis parallel to the holding surface of the chuck table such that the spindle is capable of rotating. A rotary drive source, such as a motor, that causes the spindle to rotate is housed in the spindle housing 98, and this rotary drive source is driven to cause the spindle to start rotating. The annular cutting blade 100 is fixed to a distal end of the spindle. The rotation of the spindle causes the cutting blade 100 to rotate. The cutting blade 100 includes a grinding wheel portion including an annular binder made of a metal material, a resin material, or the like, and abrasive grains of diamond or the like distributed over and fixed in the binder.

The cutting unit 96 further includes a pair of cutting fluid feed nozzles 102 extending along both side surfaces of the cutting blade 100. While the wafer 19 is being cut by the cutting blade 100, a cutting fluid, such as pure water, is fed from each of the cutting fluid feed nozzles 102 to the cutting blade 100. Debris and heat generated during the cutting of the wafer 19 by the cutting blade 100 are removed by the cutting fluid.

In the division step S50, the wafer 19 is loaded onto the cutting apparatus 94, and the wafer 19 is held under suction by the chuck table. Then, the chuck table is rotated to make the orientation of the planned dividing lines 15 of the wafer 19 match processing feed directions of the cutting apparatus 94. In addition, the chuck table is moved along the holding surface to position the cutting blade 100 over one of the planned dividing lines 15. Thereafter, the rotary drive source, such as the motor, having the cutting blade 100 attached at a distal end thereof is driven to start the rotation of the cutting blade 100. Next, the cutting blade 100 is lowered to a predetermined height, and the processing feed unit is driven to perform the processing feed of the chuck table to bring the grinding wheel portion of the rotating cutting blade 100 into contact with the wafer 19, so that the wafer 19 is cut. When the wafer 19 is cut along the planned dividing lines 15, division grooves 29 are formed in the wafer 19.

Once the division grooves 29 are formed along all the planned dividing lines 15 of the wafer 19, the division of the wafer 19 is complete, resulting in the individual device chips each provided with one of the devices 17 being manufactured. The device chips are still supported by the dicing tape 23. Thereafter, the dicing tape 23 is expanded radially outward in an opening of the ring frame 25, resulting in widened gaps between the device chips and increased ease with which the device chips are picked up off the dicing tape 23. Then, the device chips are picked up off the dicing tape 23, whereby the device chips are finally obtained. As described above, the individual device chips each provided with one of the devices 17 are manufactured by the device chip manufacturing method according to the present embodiment.

Here, the height (i.e., the first height $H_1$) of the first focal point 52b, at which the first laser beam 52a is focused, and the height (i.e., the second height $H_2$) of the second focal point 52d, at which the second laser beam 52c is focused, will be described in detail below.

The second height $H_2$ of the second focal point 52d, at which the second laser beam 52c is focused, is set at a height that is more distant from the first surface 11a of the wafer 11 than the first height $H_1$ of the first focal point 52b, at which the first laser beam 52a is focused. To describe this from another viewpoint, in the device chip manufacturing method according to the present embodiment etc., the first height $H_1$ is set at a level between the second height $H_2$ and the first surface 11a. In this case, when the second laser beam 52c is focused at the second focal point 52d in the separation start position forming step S20, components of the second laser beam 52c which make no contribution to the formation of the separation start position 70 pass through the second focal point 52d to impinge on the protective layer 64. Then, the second laser beam 52c reaches the first surface 11a of the wafer 11 in a state of being reduced in intensity due to reflection, absorption, diffusion, etc. of the second laser beam 52c by the protective layer 64. It is also possible that the second laser beam 52c does not reach the first surface 11a. Accordingly, damage to the devices 17 is less likely to occur than in a case where the second laser beam 52c does not pass through the protective layer 64 and is not reduced in intensity.

In the related art, limitations are placed on the irradiation conditions for the second laser beam 52c to prevent any of the devices 17 from being damaged when the second laser beam 52c passes through the second focal point 52d and reaches the first surface 11a. Moreover, in the related art, it is necessary to set the second focal point 52d of the second laser beam 52c at a predetermined distance or more from the first surface 11a. In contrast, in a case where the protective layer 64 has been formed in advance at a position that is closer to the first surface 11a than the second focal point 52d, it is possible to apply the second laser beam 52c to the wafer 11 with irradiation conditions that would cause damage to the devices 17 in the related art. Thus, it may be possible to apply the second laser beam 52c to the wafer 11 with irradiation conditions that lead to increased quality of the separation start position 70 to be formed.

In addition, in a case where the protective layer 64 has been formed, it is possible to cause the second laser beam 52c to be focused at a height closer to the first surface 11a than that in the related art, and the separation start position 70 can thus be formed at a height closer to the first surface 11a. In this case, the amount of material to be cut off from the wafer 11 in the grinding step S40 to be performed after the separation step S30 can be reduced, leading to a reduction in the amount of wear of the grindstones 92 and an extended life of the grinding wheel 88. When the separation start position 70 is formed closer to the first surface 11a, the separated piece 21 to be separated from the wafer 11 in the separation step S30 will have an increased thickness. The separated piece 21 having an increased thickness can be used as a new wafer 11 for manufacturing additional device chips. Even when a device wafer is produced from the new wafer 11, a thick separated piece can be left. That is, it is made possible to manufacture a greater number of device chips with a reduced loss of the material.

Here, the irradiation conditions for the laser beam will be described below. In each of the protective layer forming step S10 and the separation start position forming step S20, the laser beam 52a or 52c is emitted onto the wafer 11 with various types of parameters included in the irradiation conditions set to appropriate values or the like. Examples of items of the irradiation conditions include the wavelength of the laser beam 52a or 52c, repetition frequency, average power, processing feed rate, the path of processing feed, and the height of the focal point 52b or 52d.

In the protective layer forming step S10, the irradiation conditions for the first laser beam 52a are set such that the protective layer 64, which performs a predetermined function, can be formed within the wafer 11. That is, the first laser beam 52a, which contributes to the formation of the protective layer 64, is emitted onto the wafer 11 with predetermined irradiation conditions to enable the intensity of the second laser beam 52c to be reduced to a sufficient degree when the second laser beam 52c passes through the formed protective layer 64. However, note that, with respect to the first laser beam 52a, it is sufficient that a modified layer having a predetermined quality which enables the modified layer to serve as the protective layer 64 can thereby be formed in the wafer 11. Unlike the second laser beam 52c, the first laser beam 52a does not need to be capable of forming a crack, which extends from the protective layer 64, in the wafer 11. Note, however, that the first laser beam 52a may form a crack in the wafer 11.

In particular, the first focal point 52b is closer to the first surface 11a than the second focal point 52d, and the wafer 11 is not provided with another protective layer that shields the first laser beam 52a when the first laser beam 52a is emitted onto the wafer 11. Therefore, the irradiation conditions for the first laser beam 52a are set such that damage or the like will not be caused to the devices 17 when components of the first laser beam 52a reaches the first surface 11a, passing through the first focal point 52b without being, for example, absorbed by the wafer 11.

In addition, the irradiation conditions for the first laser beam 52a may be described in comparison with, in particular, the irradiation conditions for the second laser beam 52c, which is emitted onto the wafer 11 in the separation start position forming step S20. The irradiation conditions for the first laser beam 52a are set such that the first laser beam 52a will be lower in intensity than the second laser beam 52c. That is, the first laser beam 52a, which is emitted in the protective layer forming step S10, has a smaller impact on the devices 17 than an impact to be made by the second laser beam 52c on the devices 17. Note, however, that the irradiation conditions for the first laser beam 52a and the irradiation conditions for the second laser beam 52c are not limited to the above examples. Note that the impact to be made by the second laser beam 52c on the devices 17, which has been compared with the impact made by the first laser beam 52a on the devices 17, refers to an impact to be made by the second laser beam 52c on the devices 17 if the second laser beam 52c reaches the first surface 11a without passing through the protective layer 64.

Note that, in the protective layer forming step S10, the protective layer 64 may not necessarily be formed all over the wafer 11 on a plane parallel to the first surface 11a. The area where the protective layer 64 is formed may be determined so as to match the region where the second laser beam 52c is applied (i.e., the locus of the second focal point 52d). That is, the locus of the first focal point 52b in the protective layer forming step S10 and the locus of the second focal point 52d in the separation start position forming step S20 may correspond with each other when projected on a plane parallel to the first surface 11a.

In addition, the irradiation conditions for the second laser beam 52c are preferably set such that the separation start position 70, including the modified layer 66 and the crack 68, can be formed with predetermined qualities at the second height $H_2$ in the wafer 11. In the device chip manufacturing method according to the present embodiment etc., components of the second laser beam 52c which have passed through the second focal point 52d impinge on the protective layer 64 to be, for example, reflected and attenuated thereby. This makes it possible to emit the second laser beam 52c onto the wafer 11 with more intensive irradiation conditions than that in the related art.

The first height $H_1$, which is the height of the first focal point 52b, and the second height $H_2$, which is the height of the second focal point 52d, will be described more specifically below. The following description assumes an example case where the wafer 11 is a silicon wafer, the thickness T (i.e., the distance between the first surface 11a and the second surface 11b) of the wafer 11 is 500 μm, and the finish thickness $T_E$ of the wafer 11, 19 obtained after the grinding step S40 is 30 μm.

In this case, the first height $H_1$, which is the height of the first focal point 52b at which the first laser beam 52a is focused, is preferably set at a level higher than the first surface 11a by a distance in the range of 40 to 80 μm both inclusive. That is, the first height $H_1$ is preferably set at a position that is more distant from the first surface 11a than the height at which the rear surface 11c of the wafer 11, 19 is planned to lie after the grinding by a distance in the range of 10 to 50 μm both inclusive. The first height $H_1$ is preferably determined such that this range is satisfied with reference to the amount of grinding of the grinding step S40.

Moreover, in this case, the second height $H_2$, which is the height of the second focal point 52d at which the second laser beam 52c is focused, is preferably set at a level higher than the first surface 11a by a distance in the range of 90 to 130 μm both inclusive. That is, the second height $H_2$ is preferably set at a position that is more distant from the first surface 11a than the first height $H_1$ by approximately 50 μm. Further, the second height $H_2$ is preferably set closer to the first surface 11a to allow the separated piece 21 to be separated at the separation start position 70 to have a greater thickness.

The wafer processing method and the device chip manufacturing method according to the present embodiment provide greater flexibility than that in the related art, in choosing the irradiation conditions for the second laser beam 52c and enable choice of more appropriate irradiation conditions. In addition, it is made possible to form the separation start position 70 at a height closer to the first surface 11a, leading to a greater thickness of the separated piece 21, which leads to an easier reuse of the separated piece 21 as a device wafer. Accordingly, the wafer processing method and the device chip manufacturing method according to the present embodiment enable efficient thinning of the wafer 11 having the devices 17 arranged on the first surface 11a thereof, and efficient manufacture of the device chips through the division of the wafer 11.

Note that, in the foregoing description of the embodiment, the application of the first laser beam 52a and the second laser beam 52c to the wafer 11 has been described with reference to the case where the wafer 11 is a silicon wafer, but the wafer 11 is not limited to the silicon wafer. For example, the wafer 11 may alternatively be a SiC wafer or a wafer made of another material. Even in a case where the wafer 11 is not a silicon wafer, the irradiation conditions for the first laser beam 52a are preferably determined so as to enable the protective layer 64 to be formed in the wafer 11. In addition, the irradiation conditions for the second laser beam 52c are preferably determined so as to enable the separation start position 70 to be formed in the wafer 11.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for processing a wafer having a first surface and a second surface opposite to the first surface and having a plurality of devices formed on the first surface, the wafer processing method comprising:
   a protective layer forming step of positioning a first focal point of a first laser beam having a wavelength capable of penetrating the wafer at a first height within the wafer and emitting the first laser beam onto the wafer from a side on which the second surface lies while moving the first focal point and the wafer relative to each other along the first surface, thereby forming a protective layer at the first height in the wafer;
   a separation start position forming step of, after the protective layer forming step, positioning a second focal point of a second laser beam having a wavelength capable of penetrating the wafer at a second height within the wafer, the second height being more distant from the first surface than the first height, and emitting the second laser beam onto the wafer from the side on which the second surface lies while moving the second focal point and the wafer relative to each other along the first surface, thereby forming a modified layer at the second height in the wafer and forming a crack extending from the modified layer, to form a separation start position made up of the modified layer and the crack; and
   a separation step of, after the separation start position forming step, applying an external force to the wafer to divide the wafer at the separation start position and separating a piece including the second surface from the wafer, thereby eliminating the second surface from the wafer.

2. The wafer processing method according to claim 1, wherein the first laser beam in the protective layer forming step has a smaller impact on the devices than an impact to be made by the second laser beam on the devices if the second laser beam reaches the first surface without passing through the protective layer.

3. The wafer processing method according to claim 1, further comprising:
   a grinding step of, after performing the separation step, grinding a rear surface of the wafer exposed on a side opposite to the first surface, thereby removing the protective layer and flattening the rear surface.

4. A device chip manufacturing method for manufacturing device chips by dividing a wafer having a first surface and a second surface opposite to the first surface and having a plurality of devices formed on the first surface, the device chip manufacturing method comprising:
   a protective layer forming step of positioning a first focal point of a first laser beam having a wavelength capable of penetrating the wafer at a first height within the wafer and emitting the first laser beam onto the wafer from a side on which the second surface lies while moving the first focal point and the wafer relative to each other along the first surface, thereby forming a protective layer at the first height in the wafer;
   a separation start position forming step of, after the protective layer forming step, positioning a second focal point of a second laser beam having a wavelength capable of penetrating the wafer at a second height within the wafer, the second height being more distant from the first surface than the first height, and emitting the second laser beam onto the wafer from the side on which the second surface lies while moving the second focal point and the wafer relative to each other along the first surface, thereby forming a modified layer at the second height in the wafer and forming a crack extending from the modified layer, to form a separation start position made up of the modified layer and the crack;
   a separation step of, after the separation start position forming step, applying an external force to the wafer to divide the wafer at the separation start position and separating a piece including the second surface from the wafer, thereby eliminating the second surface from the wafer;
   a grinding step of, after the separation step, grinding a rear surface of the wafer exposed on a side opposite to the first surface, thereby removing the protective layer and flattening the rear surface; and
   a division step of dividing the wafer into pieces each having one of the devices, thereby manufacturing a plurality of device chips each provided with one of the devices.

5. The device chip manufacturing method according to claim 4, wherein the first laser beam in the protective layer forming step has a smaller impact on the devices than an impact to be made by the second laser beam on the devices if the second laser beam reaches the first surface without passing through the protective layer.

* * * * *